United States Patent
Uemura et al.

(10) Patent No.: US 7,732,255 B2
(45) Date of Patent: Jun. 8, 2010

(54) FLIP CHIP MOUNTING METHOD BY NO-FLOW UNDERFILL

(75) Inventors: Naruhiko Uemura, Tokyo (JP); Takashi Mori, Tokyo (JP); Hirofumi Matsumoto, Tokyo (JP)

(73) Assignee: Nippon Mektron, Ltd., Tokyo (JP)

( * ) Notice: Subject to any disclaimer, the term of this patent is extended or adjusted under 35 U.S.C. 154(b) by 381 days.

(21) Appl. No.: 11/901,798

(22) Filed: Sep. 19, 2007

(65) Prior Publication Data

US 2008/0153202 A1 Jun. 26, 2008

(30) Foreign Application Priority Data

Dec. 20, 2006 (JP) .............................. 2006-343392

(51) Int. Cl.
- H01L 21/44 (2006.01)
- H01L 21/48 (2006.01)
- H01L 21/50 (2006.01)

(52) U.S. Cl. ................................ 438/108; 257/E21.001
(58) Field of Classification Search .......... 257/E21.001; 438/108

See application file for complete search history.

(56) References Cited

U.S. PATENT DOCUMENTS 6,674,172 B2 * 1/2004 Vincent ...................... 257/777
7,279,359 B2 * 10/2007 Chen et al. .................. 438/108

FOREIGN PATENT DOCUMENTS

JP 10-125724 5/1998
JP 2001-053109 2/2001

* cited by examiner

*Primary Examiner*—Asok K Sarkar
(74) *Attorney, Agent, or Firm*—Fattibene and Fattibene; Paul A. Fattibene

(57) ABSTRACT

In a flip shop mounting method by a no-flow underfill in which resin is pre-coated on a substrate 52, and, thereafter, a semiconductor 50 with bump is mounted on the substrate 52 to join a pad electrode 53 on the substrate 52 to the bump 51, a resin 54a highly filed with the filler 55 is applied to a region except for the pad electrode 53 on the substrate 52, a resin 54b being free from the filler is applied to a pad electrode 53 portion on the substrate 52, and, thereafter, the semiconductor 50 with bump is mounted at a predetermined position on the substrate 52.

1 Claim, 5 Drawing Sheets

FLIP CHIP MOUNTING METHOD BY NO-FLOW UNDERFILL

TECHNICAL FIELD

The present invention relates to a flip chip mounting method by no-flow underfill and, more particularly, to a flip chip mounting method by a no-flow underfill in which, when a resin highly filled with a filler is pre-coated on a substrate, a bump is brought into reliable contact with a bump electrode without sandwiching the filler between the bump of a semiconductor and a pad electrode on the substrate to make it possible to reliably perform reflow soldering.

BACKGROUND ART

In recent years, with a reduction in size of electric devices, in order to improve a space-saving property and electric characteristics, semiconductors are frequently mounted on substrates by a flip chip mounting method. In the flip chip mounting method, a projection electrode called a bump is formed on a terminal electrode formed on a rear surface of a semiconductor chip, a semiconductor is fixed to the pad electrode formed on the substrate through the bump to achieve electric conduction.

The bump consists of a solder material or the like. However, since a junction area is small, amounting strength often lacks. In addition, distortion occurs due to a difference or the like between coefficient of thermal expansions of the substrate and the semiconductor, and the bump may be fall off from the pad electrode because of mechanical shock or thermal shock. Therefore, in order to improve the joint strength, after the bump is joined to the pad electrode on the substrate by thermal welding, an underfill process which pours an epoxy-based resin into a gap between the semiconductor and the substrate and then thermally cures the resin is performed.

However, since the underfill process requires heating processes for connection between electrodes by soldering and curing of the resin and includes a large number of heating steps to increase the cost. Furthermore, workability for pouring a resin from a side of the gap between the semiconductor and the substrate is poor, a space for pouring the resin is necessary. The underfill process is disadvantageous to a reduction in size of an electric device.

In order to solve the drawback, the following mounting method by a no-flow underfill is proposed (for example, see Patent Document 1). That is, a resin is pre-coated on a substrate, and, thereafter, a semiconductor with bump is pressed onto the substrate to spread the pre-coated resin so as to bring the bump and the pad electrode into contact with each other. In this state, the resultant structure is heated to perform connection between the electrodes and curing of the resin by performing a heating step once.

In this case, powder such as alumina powder or silica powder called filler is mixed in the epoxy-based resin used in the underfill process or the no-flow underfill process to increase the strength of the resin. In the underfill process, since a resin is poured after the bump is joined to a pad electrode, the filler does not adverse affect the resin.

However, in the no-flow underfill process, as shown in FIG. 4, since the bump 51 is brought into contact with the pad electrode 53 of the substrate 52 by only the weight of the semiconductor 50, the filler 55 mixed in resin 54 is sandwiched between the bump 51 and the pad electrode 53, and a gap may be formed between the bump 51 and the pad electrode 53. In the no-flow underfill process, since connection between electrodes and curing of the resin are performed in the same heating step, when the gap is formed between the bump 51 and the pad electrode 53, the gap is filled with the resin 54 not to achieve electric conduction.

As shown in FIG. 5, when the semiconductor 50 is forcibly pressed to the substrate 52 by the heavy weight 56 or the like, the filler 55 is pressed out, or electric conduction between the bump 51 and the pad electrode 53 is assured while convoluting the filler 55. However, in this state, when reflow soldering is performed, after the bump 51 is thermally welded on the pad electrode 53, the weight of the heavy weight 56 continuously operates. For this reason, the bump 51 may be broken by pressure, or the bump may run out of the pad electrode 53 to cause electric short circuit.

As a configuration using a heavy weight in the no-flow underfill process, the following apparatus and method are known. That is, a resin containing spherical particles is applied onto an upper surface of a substrate, and the spherical particles are arranged in a region between pad electrodes, a heavy weight is placed on an upper portion of a semiconductor to perform reflow soldering without any change (for example, see Patent Document 2).

Patent Document 1: Japanese Unexamined Patent Publication No. 10-125724

Patent Document 2: Japanese Unexamined Patent Publication No. 2001-53109

DISCLOSURE OF THE PATENT

The invention according to Patent Document 1, a resin is pre-coated on a substrate, connection between electrodes and curing of the resin are performed by performing a heating step once. For this reason, a reduction in cost is achieved by simplifying steps. However, as shown in FIG. 4, the filler mixed in the resin is sandwiched between the bump and the pad electrode, and electric conduction may not be achieved. When the filler mixed in the resin is lessened or the resin is not mixed, a drawback caused by sandwiching the filler can be solved. However, the strength of the resin may be deteriorated to break the bump.

The invention according to Patent Document 2, filler is pressed out by a heavy weight, or the filler is convoluted to assure electric conduction between a bump and a pad electrode. At the same time, spherical particles are mixed in a resin to hold an interval between a semiconductor and a substrate at a predetermined size. However, the spherical particles are not always accurately arranged in a region between pad electrode, and the heavy weight may be displaced.

Therefore, the present invention has the following object. That is, in a flip chip mounting method by a no-flow underfill, when a resin highly filled with the filler is pre-coated on a substrate, a bump is brought into reliably contact with a pad electrode without sandwiching the filler between the bump of a semiconductor and the pad electrode of a substrate to make it possible to reliably perform reflow soldering.

The present invention is proposed to achieve the object, and the invention according to a first aspect provides a flip chip mounting method by a no-flow underfill in which a resin is pre-coated on a substrate, thereafter, a semiconductor with a bump is mounted on the substrate, and a pad electrode of the substrate and the bump are joined to each other, wherein a resin highly filled with the filler is applied to a region except for the pad electrode on the substrate, a resin being free from the filler is applied to a pad electrode portion on the substrate, and, thereafter, the substrate with bump is mounted at a predetermined position on the substrate.

According to the configuration, the resin being free from the filler is applied to the pad electrode portion on the substrate, the resin highly filled with the filler is applied to the remaining region, and the semiconductor is mounted. In this manner, when the resin is selected and applied, the filler is not present between the bump and the pad electrode. For this reason, the bump is brought into reliable contact with the pad electrode without sandwiching the filler.

In this state, when reflow soldering is performed, the bump is reliably joined to the pad electrode by thermal welding without connection hindered by the filler. Furthermore, the filler-free resin and the resin highly filled with the filler are mixed with each other, and an underfill is formed by the resin highly filled with the filler is formed between the semiconductor and the substrate.

The present invention, as described above, the filler-free resin and the resin highly filled with the filler are selected and applied to apply the filler-free resin to the pad electrode portion on the substrate. For this reason, in the reflow soldering, the filler is not sandwiched between the bump and the pad electrode, and the bump is reliably joined to the pad electrode.

In this manner, the semiconductor can be reliably mounted by using the resin highly filled with the filler. The present invention can contribute to improvement of workability and reliability in a flip chip mounting method by a now-flow underfill.

BEST MODE FOR CARRYING OUT THE INVENTION

A flip chip mounting method by a no-flow underfill according to the present invention will be described below with reference to preferred embodiments. When a resin highly filled with the filler is pre-coated on a substrate, in order to bring the bump into reliable contact with the pad electrode without sandwiching a the filler between a bump of a semiconductor and a pad electrode and to reliably perform reflow soldering, the present invention realizes a flip chip mounting method by a no-flow underfill in which a resin is pre-coated on the substrate in the present invention, and, thereafter, a semiconductor with bump is mounted on the semiconductor to join the pad electrode on the substrate to the bump, wherein a resin highly filled with the filler is applied to a region except for the pad electrode on the substrate, a resin being free from the filler is applied to a pad electrode portion on the substrate, and, thereafter, the semiconductor with bump is mounted at a predetermined position on the substrate.

Figure 1:
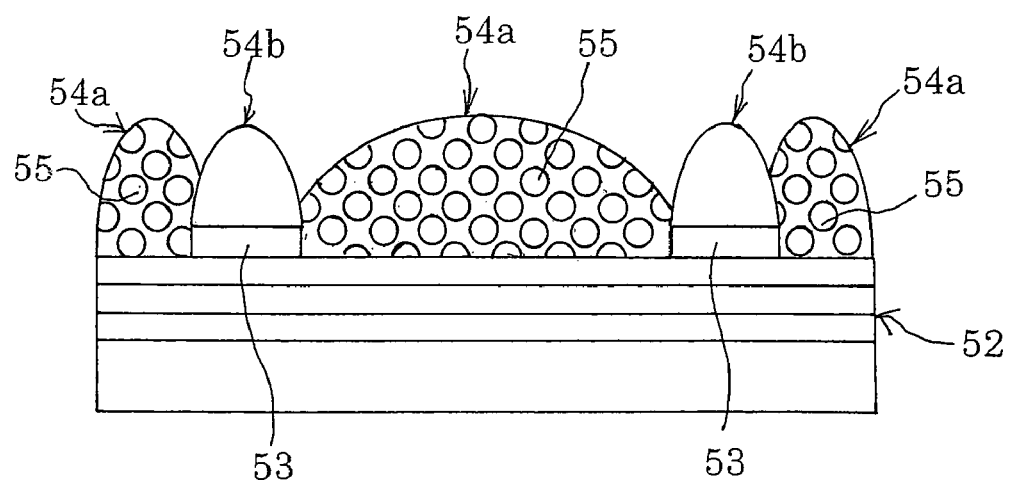
FIG. 1 is an explanatory pattern diagram showing an example of a mounting method according to the present invention.

FIG. 1 is an explanatory pattern diagram showing an example of the mounting method according to the present invention. A substrate 52 is fixed at a position of a base (not shown) of a reflow jig, and an epoxy-based resin is pre-coated on a surface of the substrate 52 on which a pad electrode 53 is formed. However, on the portion of the pad electrode 53 and the region except for the pad electrode 53, different resins are selectively applied.

In a region except for the pad electrode 53 on the surface of the substrate 52, a resin 54a highly filled with the filler 55 is applied. Thereafter, a resin 54b being free from the filler is applied to a portion of the pad electrode 53 on the surface of the substrate 52. The resin 54a highly filled with the filler and the resin 54b being free from the filler have different viscosities. When the resins are adjacently applied, the resins are prevented from being easily mixed with each other on a boundary portion between the applied portions.

Figure 2:
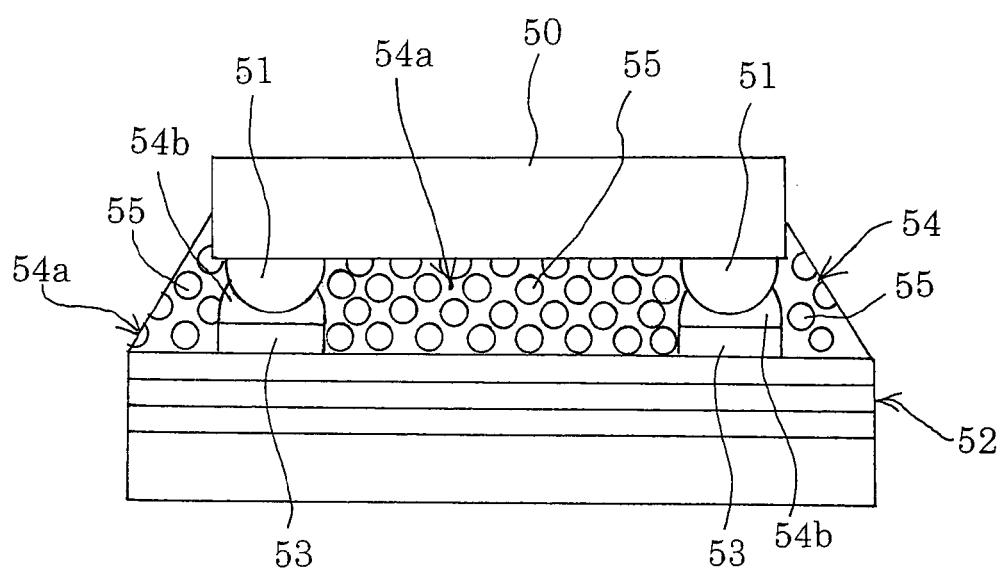
FIG. 2 is an explanatory diagram showing operation processes of the mounting method in FIG. 1.

As shown in FIG. 2, a bump 51 formed on a rear surface of a semiconductor 50 and the pad electrode 53 on the substrate 52 are positioned to be vertically opposite to each other. In this state, the filler-free resin 54b is interposed between the bump 51 and the pad electrode 53. When the semiconductor 50 is pressed downward to bring the substrate 51 into contact with the pad electrode 53, the filler 55 is not sandwiched, and the bump 51 is brought into reliable contact with the pad electrode 53.

Figure 3:
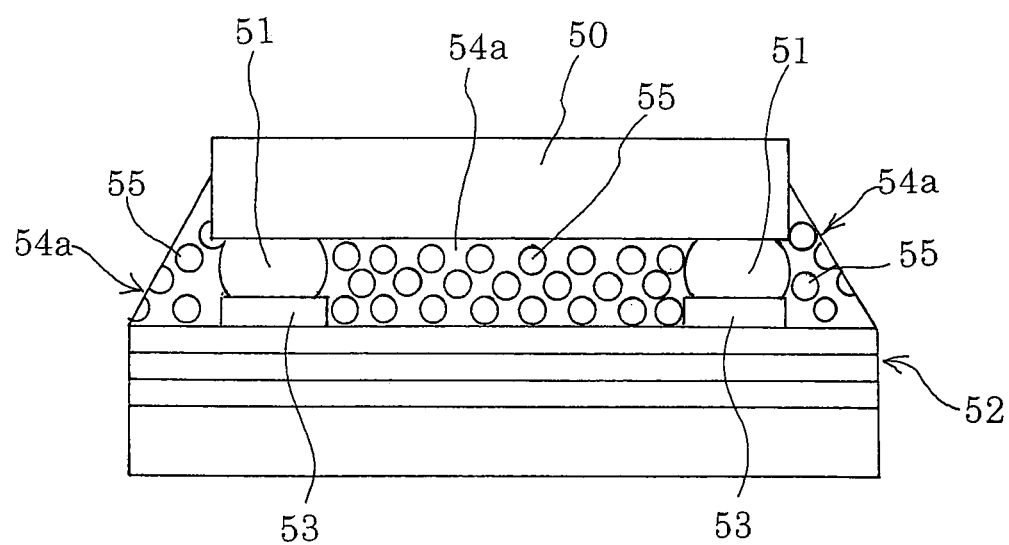
FIG. 3 is an explanatory diagram showing a final process of the mounting method in FIG. 1.
Figure 4:
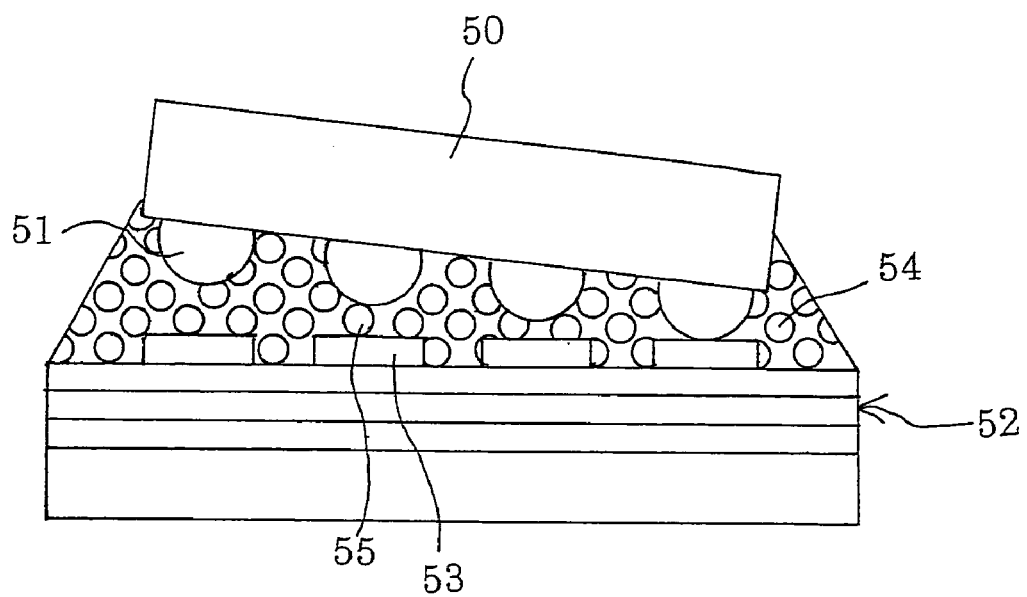
FIG. 4 is an explanatory pattern diagram showing a drawback of a conventional no-flow under fill process.
Figure 5:
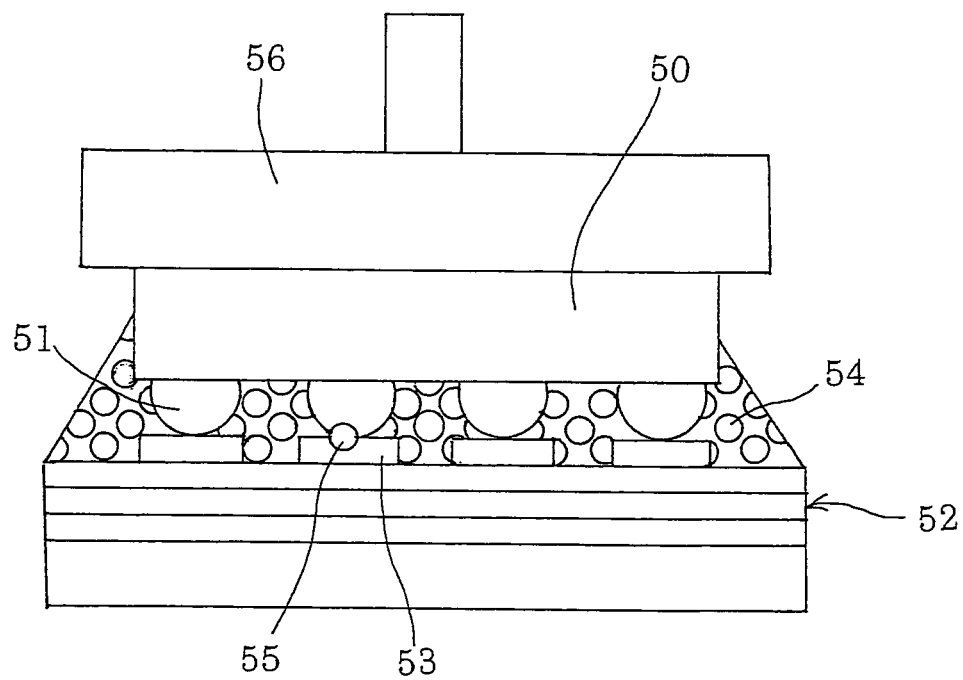
FIG. 5 is an explanatory pattern diagram showing an example for solving the drawback shown in FIG. 4 by a heavy weight.

In this state, when heating is performed by the reflow soldering process, the bump 51 is thermally welded to be reliably joined to the pad electrode 53 on the substrate 52 without connection hindered by the filler 55, and the resins 54a and 54b are cured to protect the circumferences of the bump 51 and the pad electrode 53 as show in FIG. 3.

At this time, the filler-free resin 54b and the filler-highly-filled resin 54a are mixed with each other at a position near the pad electrode 53. As a whole, an underfill is formed by the resin 54a highly filled with the filler 55 between the semiconductor 50 and the substrate 52.

In this manner, the resin 54a highly filled with the filler 55 and the filler-free resin 54b are selected and applied to the substrate 52 to prevent the filler 55 from being sandwiched between the bump 51 and the pad electrode 53. Therefore, the semiconductor 50 can be reliably mounted by using only the weight of the semiconductor 50 without using a heavy weight or the like. The present invention can contribute to improvement of workability and reliability in the flip chip mounting method by the no-flow underfill.

Various modifications of the present invention can be effected without departing from the spirit and scope of the present invention. It is natural that the present invention covers the modifications.

What is claimed is:

1. A flip chip mounting method by a no-flow underfill in which a resin is pre-coated on a substrate, and, thereafter, a semiconductor with bump is mounted on the substrate to join a pad electrode on the substrate to the bump, wherein
a resin highly filled with the filler is applied to a region except for the pad electrode on the substrate, a resin being free from the filler is applied to the pad electrode portion on the substrate, and, thereafter, the semiconductor with bump is mounted at a predetermined position on the substrate.

* * * * *